US011984164B2

(12) United States Patent
Yuh et al.

(10) Patent No.: US 11,984,164 B2
(45) Date of Patent: *May 14, 2024

(54) NON-VOLATILE STATIC RANDOM ACCESS MEMORY (nvSRAM) WITH MULTIPLE MAGNETIC TUNNEL JUNCTION CELLS

(71) Applicant: Taiwan Semiconductor Manufacturing Company, Ltd., Hsinchu (TW)

(72) Inventors: Perng-Fei Yuh, Hsinchu (TW); Yih Wang, Hsinchu (TW); Ku-Feng Lin, New Taipei (TW); Jui-Che Tsai, Tainan (TW); Hiroki Noguchi, Hsinchu (TW); Fu-An Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/300,706

(22) Filed: Apr. 14, 2023

(65) Prior Publication Data
US 2023/0298665 A1    Sep. 21, 2023

Related U.S. Application Data

(63) Continuation of application No. 17/409,341, filed on Aug. 23, 2021, now Pat. No. 11,657,873, which is a (Continued)

(51) Int. Cl.
*G11C 14/00*    (2006.01)
*G11C 11/16*    (2006.01)
*G11C 11/419*   (2006.01)

(52) U.S. Cl.
CPC ........ *G11C 14/0081* (2013.01); *G11C 11/161* (2013.01); *G11C 11/1659* (2013.01); *G11C 11/1675* (2013.01); *G11C 11/419* (2013.01)

(58) Field of Classification Search
CPC . G11C 14/0081; G11C 11/419; G11C 11/161; G11C 11/1675; G11C 11/1659
See application file for complete search history.

(56) References Cited

U.S. PATENT DOCUMENTS 6,317,359 B1   11/2001   Black et al.
8,023,299 B1    9/2011   Gharia
(Continued)

FOREIGN PATENT DOCUMENTS

CN    1659660 A      8/2005
CN    103151355 A    6/2013
(Continued)

OTHER PUBLICATIONS

Higher Performance Logic Systems for Less Power; 4 pages.
(Continued)

*Primary Examiner* — Mushfique Siddique
(74) *Attorney, Agent, or Firm* — FOLEY & LARDNER LLP

(57) ABSTRACT

Disclosed herein is an integrated circuit including multiple magnetic tunneling junction (MTJ) cells coupled to a static random access memory (SRAM). In one aspect, the integrated circuit includes a SRAM having a first port and a second port, and a set of pass transistors coupled to the first port of the SRAM. In one aspect, the integrated circuit includes a set of MTJ cells, where each of the set of MTJ cells is coupled between a select line and a corresponding one of the set of pass transistors.

20 Claims, 11 Drawing Sheets

Related U.S. Application Data continuation of application No. 16/732,219, filed on Dec. 31, 2019, now Pat. No. 11,107,530.

(56) References Cited

U.S. PATENT DOCUMENTS

| | | | |
|---|---|---|---|
| 8,537,597 | B2 | 9/2013 | Kushida |
| 9,183,914 | B2 | 11/2015 | Owada |
| 9,196,337 | B2 | 11/2015 | Jung et al. |
| 9,311,994 | B2 | 4/2016 | Di Pendina et al. |
| 9,349,440 | B1 | 5/2016 | Ma |
| 9,564,209 | B1 | 2/2017 | Lee et al. |
| 10,706,914 | B2 | 7/2020 | Tseng et al. |
| 10,755,772 | B1 | 8/2020 | Liu et al. |
| 10,777,268 | B2 | 9/2020 | Gopinath et al. |
| 10,854,291 | B2 | 12/2020 | Jaiswal et al. |
| 10,916,583 | B2 | 2/2021 | Wang |
| 10,964,366 | B2 | 3/2021 | Ohmori et al. |
| 10,971,229 | B2 | 4/2021 | Jaiswal et al. |
| 10,991,756 | B2 | 4/2021 | Lai et al. |
| 11,049,563 | B1 | 6/2021 | Liao et al. |
| 11,075,207 | B2 | 7/2021 | Sharma et al. |
| 11,087,837 | B2 | 8/2021 | Huynh Bao et al. |
| 11,101,318 | B2 | 8/2021 | Kumar et al. |
| 2008/0225590 | A1 | 9/2008 | Lamorey |
| 2009/0109734 | A1 | 4/2009 | Hanafi |
| 2010/0037001 | A1 | 2/2010 | Langlois et al. |
| 2010/0188891 | A1 | 7/2010 | Taniguchi et al. |
| 2011/0273925 | A1 | 11/2011 | Yamamoto et al. |
| 2012/0020159 | A1 | 1/2012 | Ong |
| 2012/0320658 | A1 | 12/2012 | Wang et al. |
| 2013/0028012 | A1 | 1/2013 | Fujita et al. |
| 2014/0281189 | A1 | 9/2014 | Noguchi et al. |
| 2014/0334216 | A1 | 11/2014 | Wang et al. |
| 2014/0339616 | A1 | 11/2014 | Abe et al. |
| 2014/0355330 | A1 | 12/2014 | Endoh et al. |
| 2015/0332745 | A1 | 11/2015 | Ohsawa et al. |
| 2016/0246539 | A1* | 8/2016 | Sadd .................... G06F 3/0647 |
| 2016/0276031 | A1 | 9/2016 | Abe et al. |
| 2016/0329098 | A1 | 11/2016 | Javerliac et al. |
| 2017/0017434 | A1 | 1/2017 | Bang et al. |
| 2018/0082732 | A1 | 3/2018 | Luo et al. |
| 2018/0113812 | A1* | 4/2018 | Luo .................... G06F 3/0632 |
| 2018/0121212 | A1 | 5/2018 | Luo et al. |
| 2018/0174644 | A1 | 6/2018 | Sakhare et al. |
| 2019/0244666 | A1 | 8/2019 | Hsu |
| 2021/0201997 | A1 | 7/2021 | Yuh et al. |

FOREIGN PATENT DOCUMENTS

| | | |
|---|---|---|
| CN | 104733036 A | 6/2015 |
| CN | 107204200 A | 9/2017 |
| CN | 107657981 A | 2/2018 |

OTHER PUBLICATIONS

KR Notice of Reason of Refusal for KR Patent Application No. 2020-0041125 dated Jul. 8, 2021 (10 pages).

Taiwan Office Action for TW Patent Application No. 110114325 dated Jan. 25, 2022 (7 pages).

Zhao et al; Spin-MTJ based Non-Volatile Flip-Flop; Aug. 2007; 5 pages.

Office Action issued in connection with Chinese Appl. No. 202110457682.9 dated Dec. 29, 2023.

* cited by examiner

| Time | SRAM | Array1 | Array2 | ... | Array32 |
|---|---|---|---|---|---|
| 0n | WL0 | X | X | ... | X |
| 1n | WL1 | ML0 | X | ... | X |
| 2n | WL2 | ML0 | ML0 | ... | X |
| ... | ... | ... | ... | ... | ... |
| 31n | WL31 | ML0 | ML0 | ... | X |
| 32n | WL0 | ML0 | ML0 | ... | ML0 |
| 33n | WL1 | ML1 | ML0 | ... | ML0 |
| 34n | WL2 | ML1 | ML1 | ... | ML0 |
| ... | ... | ... | ... | ... | ... |
| 63n | WL31 | ML1 | ML1 | ... | ML0 |
| 64n | WL0 | ML1 | ML1 | ... | ML1 |
| 65n | WL1 | ML2 | ML1 | ... | ML1 |
| 66n | WL2 | ML2 | ML2 | ... | ML1 |

FIG. 10

NON-VOLATILE STATIC RANDOM ACCESS MEMORY (nvSRAM) WITH MULTIPLE MAGNETIC TUNNEL JUNCTION CELLS

CROSS-REFERENCE TO RELATED APPLICATION

The present application is a Continuation of U.S. application Ser. No. 17/409,341, filed Aug. 23, 2021, which is a Continuation of U.S. application Ser. No. 16/732,219, filed Dec. 31, 2019, the entire contents of both of which are incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off, but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a table describing a pipeline operation of storage circuits, each including SRAM and multiple MTJ cells, in accordance with some embodiments.

DETAILED DESCRIPTION

Figure 1:
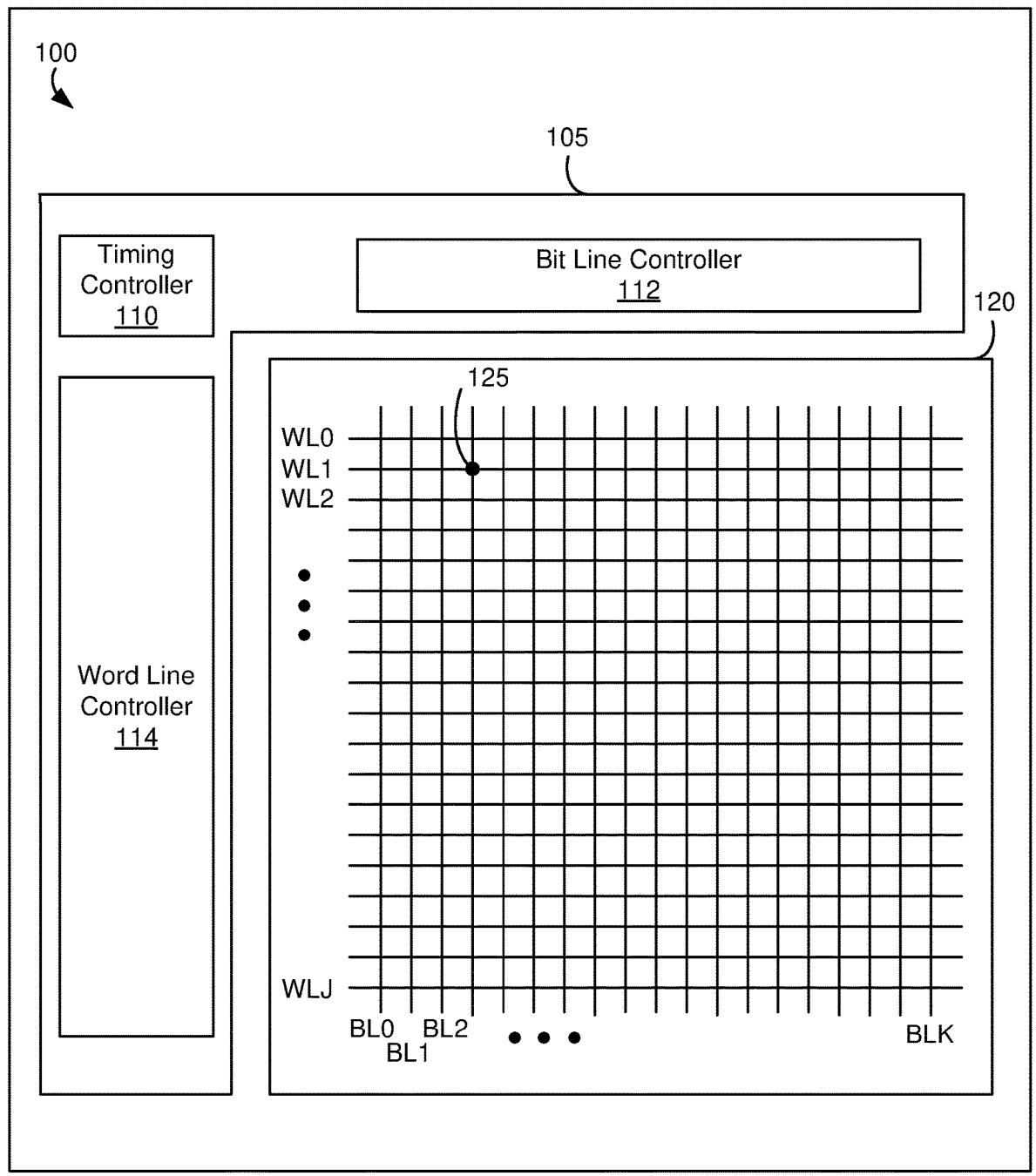
FIG. 1 is a diagram of a memory device, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit or a storage circuit includes a static random access memory (SRAM) and a first set of magnetic tunnel junction (MTJ) cells coupled to the SRAM. In one aspect, the SRAM includes a first port and a second port. In some embodiments, the integrated circuit includes a first set of pass transistors, where each of the first set of MTJ cells and a corresponding one of the first set of pass transistors are coupled to each other in series between a first select line and the first port of the SRAM. In one aspect, a speed of reading and writing of SRAM may be faster than a speed of reading and writing of an MTJ cell, but an area of SRAM may be larger than an area of the MTJ cell. In one configuration, the SRAM operates as a shared amplifier for multiple MTJ cells, where each MTJ cell stores a corresponding bit from the SRAM. Advantageously, in this configuration, the shared SRAM allows fast speed of reading and writing, where multiple MTJ cells can provide high storage density.

In accordance with some embodiments, a memory device implements multiple storage circuits, where each storage circuit is operated in a pipeline configuration. For example, a voltage or current corresponding to a first bit of data is provided to a first SRAM, and the voltage or current sensed by the first SRAM is transferred to a first MTJ cell of a first set of MTJ cells coupled to the first SRAM during a first time period. Moreover, a voltage or current corresponding to a second bit of data is provided to a second SRAM, and the voltage or current sensed by the second SRAM is transferred to a second MTJ cell of a second set of MTJ cells coupled to the second SRAM during a second time period. The first time period and the second time period may partially overlap with each other. Through pipelining, the speed of reading and writing of the memory device can improve.

In accordance with some embodiments, a memory device implements at least a first storage circuit and a second storage circuit, where a reference MTJ cell of the first storage circuit is coupled to a reference MTJ cell of the second storage circuit. In one configuration, a reference MTJ cell of the first storage circuit may be programmed in a first state to have a first resistance, and a reference MTJ cell of the second storage circuit may be programmed in a second state to have a second resistance. In one aspect, an electrode of the reference MTJ cell of the first storage circuit is coupled to an electrode of the reference MTJ cell of the second storage circuit through a reference line, such that a resistance at the reference line is an average resistance of the first resistance and the second resistance. In one approach, when reading a bit stored by a first MTJ cell of a first set of MTJ cells coupled to a first port of the SRAM, the average resistance may be applied to a second port of the SRAM and a resistance corresponding to the programmed bit of the first MTJ cell may be applied to the first port of the SRAM. Similarly, when reading a bit stored by a second MTJ cell of a second set of MTJ cells coupled to the second port of the SRAM, the average resistance may be applied to the first port of the SRAM and a resistance corresponding to the programmed bit of the second MTJ cell may be applied to the second port of the SRAM. According to a difference between a voltage at the first port and a voltage at the second port of the SRAM due to different resistances applied, a bit stored by a MTJ cell can be determined. By implementing reference MTJ cells, the first set of MTJ cells coupled to the first port of the SRAM and the second set of MTJ cells coupled to the second port of the SRAM can store data in an asymmetrical manner. Hence, storage density of the memory device can be increased (e.g., doubled) compared to storing symmetrical data by the first set of MTJ cells and the second set of MTJ cells coupled to the SRAM.

Although various embodiments disclosed herein are described with respect to a memory device including SRAM and a set of MTJ cells coupled to the SRAM, different components may be implemented in some embodiments. For example, an amplifier or other types of volatile memory device can replace the SRAM, where different types of non-volatile memory devices can replace the set of MTJ cells.

FIG. 1 is a diagram of a memory device 100, in accordance with one embodiment. In some embodiments, the memory device 100 includes a memory controller 105 and a memory array 120. The memory array 120 may include a plurality of storage units or storage circuits 125 arranged in two or three dimensional arrays. Each storage circuit may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage units or storage circuits 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one aspect, each storage circuit 125 is coupled to a corresponding word line WL and a corresponding bit line, and can be operated according to voltages or currents through the corresponding word line WL and the corresponding bit line BL. In one aspect, each storage circuit 125 includes a combination of volatile memory and non-volatile memory. For example, each storage circuit 125 includes SRAM and multiples of MTJ cells coupled to the SRAM. Employing a combination of SRAM and multiple MTJ cells for a storage circuit 125 can ensure fast operation of the memory array 120 and improve storage density. In some embodiments, the memory array 120 includes additional lines (e.g., select lines, reference lines, reference control lines, power rails, etc.). Detailed descriptions on configurations and operations of memory device 100 are provided below with respect to FIGS. 2 through 10.

The memory controller 105 is a hardware component that controls operations of the memory array 120. In some embodiments, the memory array 120 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In one example, to write data to a storage circuit 125, the word line controller 114 provides a voltage or current to the storage circuit 125 through a word line WL coupled to the storage circuit 125, and applies a bias voltage to the storage circuit 125 through a bit line BL coupled to the storage circuit 125. In one example, to read data from a storage circuit 125, the word line controller 114 provides a voltage or current to the storage circuit 125 through a word line WL coupled to the storage circuit 125, and senses a voltage or current corresponding to data stored by the storage circuit 125 through a bit line coupled to the storage circuit 125. In some embodiments, the memory controller 105 includes more, fewer, or different components than shown in FIG. 1.

Figure 2:
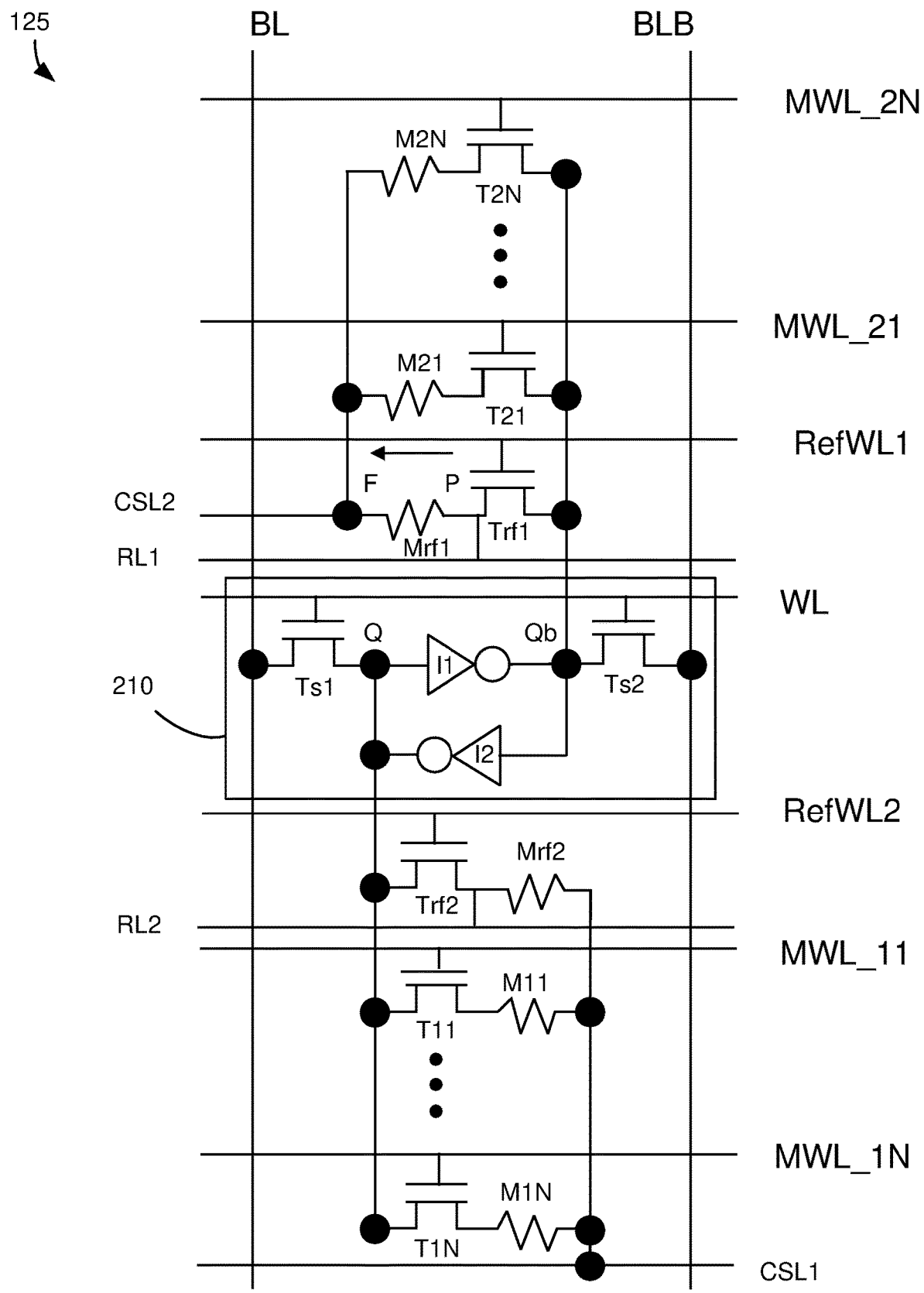
FIG. 2 is a diagram of a storage circuit including static random access memory (SRAM) with multiple magnetic tunnel junction (MTJ) cells in a writing phase, in accordance with some embodiments.

FIG. 2 is a diagram of a storage circuit 125 including SRAM with multiple magnetic tunnel junction (MTJ) cells in a writing phase, in accordance with some embodiments. In some embodiments, the storage circuit 125 includes SRAM 210 and MTJ cells. The MTJ cells include a first set of MTJ cells M11 . . . M1N and a second set of MTJ cells M21 . . . M2N. Additionally, the MTJ cells include reference MTJ cells Mrf1, Mrf2. The storage circuit 125 may also include a first set of pass transistors T11 . . . T1N, a second set of pass transistors T21 . . . T2N, and reference pass transistors Trf1, Trf2. These components may operate together to store multiple bits of data. In other embodiments, the storage circuit 125 includes more, fewer, or different components than shown in FIG. 2.

The SRAM 210 is a hardware component that interfaces with the memory controller 105. The SRAM 210 is coupled to the word line controller 114 through a word line WL and is coupled to the bit line controller 112 through bit lines BL, BLB. In one aspect, the SRAM 210 operates as a regenerative circuit or an amplifier that amplifies a difference in voltages. In some embodiments, the SRAM 210 includes inverters I1, I2, and pass transistors Ts1, Ts2. In one configuration, the inverters I1, I2 are cross coupled to each other at ports Q, Qb, where the pass transistor Ts1 is coupled between the bit line BL and the port Q, and the pass transistor Ts2 is coupled between the bit line BLB and the port Qb. Gate electrodes of the pass transistors Ts1, Ts2 are coupled to the word line WL.

In one configuration, the pass transistors Ts1, Ts2 are circuit that operate as electrical switch. The pass transistor Ts1, Ts2 may be embodied as an N-type transistor (e.g., N-type MOSFET). The pass transistors Ts1, Ts2 may allow the bit line BL to electrically couple to or decouple from the port Q and the bit line BLB to electrically couple to or decouple from the port Qb, according to a voltage applied to the word line WL. For example, according to a high voltage (e.g., VDD) applied to the word line WL, the pass transistor Ts1 is enabled to electrically couple the bit line BL to the port Q and the pass transistor Ts2 is enabled to electrically couple the bit line BLB to the port Qb. For another example, according to a low voltage (e.g., GND) applied to the word line WL, the pass transistor Ts1 is disabled to electrically decouple the bit line BL from the port Q and the pass transistor Ts2 is disabled to electrically decouple the bit line BLB from the port Qb.

The inverters I1, I2 may sense and amplify a difference in voltages at the ports Q, Qb. When writing data, the inverters I1, I2 may sense voltages at the ports Q, Qb provided through the pass transistors and amplify a difference in voltages at the bit lines BL, BLB. For example, the inverters I1, I2 sense a voltage 0.4 V at the port Q and a voltage 0.5V at the port Qb, and amplify a difference in the voltages at the ports Q, Qb through a positive feedback (or a regenerative feedback) such that the voltage at the port Q becomes GND and the voltage at the port Qb becomes VDD (e.g. 1V). One of the amplified voltages at the ports Q, Qb may be provided to a MTJ cell for writing (or programming). When reading data, the inverters I1, I2 may sense voltages, currents, or resistances of MTJ cells or reference MTJ cells and amplify a difference in voltages at the ports Q, Qb through a positive feedback (or a regenerative feedback). The amplified voltages at the ports Q, Qb may be provided to the bit lines BL, BLB through the pass transistors Ts1, Ts2, respectively for reading.

A pass transistor coupled to a corresponding MTJ cell is a circuit that operates as an electrical switch. The pass transistor may be embodied as an N-type transistor (e.g., N-type MOSFET). In one configuration, each pass transistor and a corresponding MTJ cell are coupled to each other in series between a port of the SRAM and a select line. In one example, a first electrode of the pass transistor T11 is coupled to the port Q of the SRAM 210, and a second electrode of the pass transistor T11 is coupled to a first electrode of the MTJ cell M11. A second electrode of the MTJ cell M11 is coupled to a select line CSL1. A gate electrode of the pass transistor T11 is coupled to a control line MWL_11. In this configuration, the pass transistor allows the port of the SRAM to electrically couple to or decouple from the corresponding MTJ cell, according to a voltage applied to the control line MWL. For example, according to a high voltage (e.g., VDD) applied to the control line MWL_11, the pass transistor T11 is enabled to electrically couple the port Q to the MTJ cell M11. For another example, according to a low voltage (e.g., GND) applied to the control line MWL_11, the pass transistor T11 is disabled to electrically decouple the port Q from the MTJ cell M11.

A MTJ cell is a circuit that stores a bit of data. The MTJ cell may be embodied as a non-volatile memory. In one aspect, a resistance of the MTJ cell is adjusted or modified according to a voltage applied across the MTJ cell. The MTJ cell includes a free layer and a pinned layer, where a resistance across the free layer and the pinned layer can be programmed or set according to a voltage applied across the MTJ cell. For example, if a high voltage (e.g., VDD) is applied to a free layer of the MTJ cell and a low voltage (e.g., GND) is applied to a pinned layer of the MTJ cell for at least a time period (e.g., 30 ns), the MTJ cell can be programmed to have a parallel state Rp. For example, if the high voltage (e.g., VDD) is applied to the free layer of the MTJ cell and the high voltage (e.g., VDD) is applied to the pinned layer of the MTJ cell, a state of the MTJ cell may not change. For example, if the low voltage (e.g., GND) is applied to the free layer of the MTJ cell and the high voltage (e.g., VDD) is applied to the pinned layer of the MTJ cell for at least a time period (e.g., 30 ns), the MTJ cell can be programmed to have an anti-parallel state Rap. For example, if the low voltage (e.g., GND) is applied to the free layer of the MTJ cell and the low voltage (e.g., GND) is applied to the pinned layer of the MTJ cell, a state of the MTJ cell may not change.

In some embodiments, each of the first set of MTJ cells M11 . . . M1N and a corresponding one of the pass transistors T11 . . . T1N are coupled to each other in series between the port Q and a select line CSL1. Similarly, in some embodiments, each of the second set of MTJ cells M21 . . . M2N and a corresponding one of the pass transistors T21 . . . T2N are coupled to each other in series between the port Qb and a select line CSL2. In some implementation, N is any integer number (e.g., 2~128). The reference MTJ cell Mrf1 and a pass transistor Trf1 may be coupled to each other in series between the port Qb and the select line CSL2. Similarly, the reference MTJ cell Mrf2 and a pass transistor Trf2 may be coupled to each other in series between the port Q and the select line CSL1. A gate electrode of the pass transistor Trf1 may be coupled to a control line RefWL1, and a gate electrode of the pass transistor Trf21 may be coupled to a control line RefWL2. By implementing the reference MTJ cells, the first set of MTJ cells M11 . . . M1N and the second set of MTJ cells M21 . . . M2N may store data in an asymmetrical manner, as described below with respect to FIGS. 3 through 7. Accordingly, storage density can be increased (e.g., doubled) compared to storing data in a symmetrical manner by the first set of MTJ cells M11 . . . M1N and the second set of MTJ cells M21 . . . M2N coupled to the SRAM 210.

Figure 3:
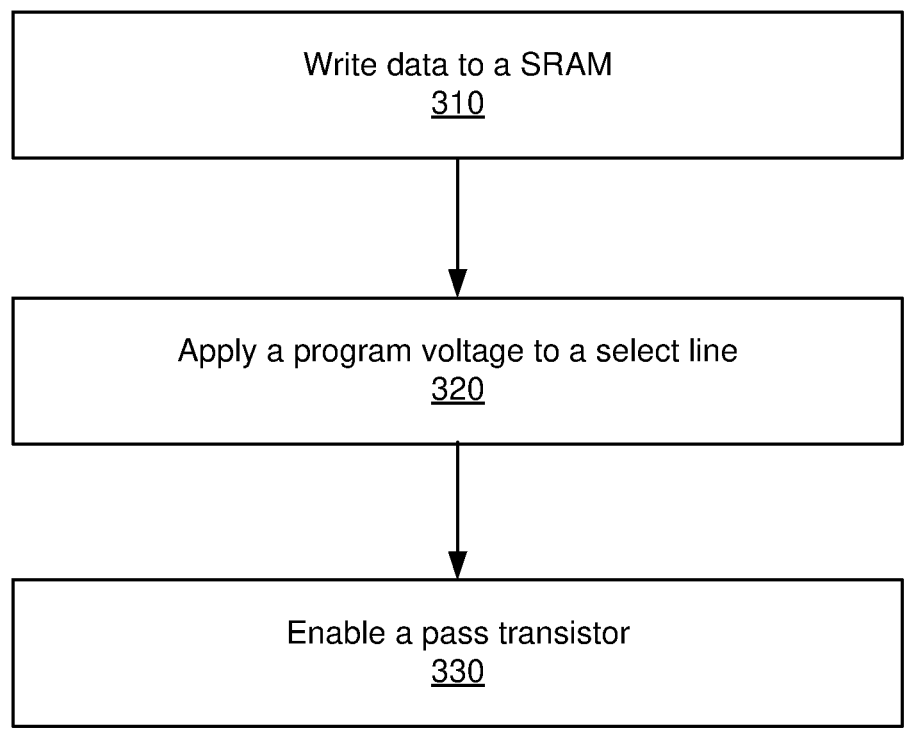
FIG. 3 is a flowchart of a method of writing data to a storage circuit including SRAM and multiple MTJ cells, in accordance with some embodiments.

FIG. 3 is a flowchart of a method 300 of writing data to a storage circuit including SRAM and multiple MTJ cells, in accordance with some embodiments. The method 300 may be performed by the memory controller 105 of FIG. 1. In some embodiments, the method 300 is performed by other entities. In one aspect, the method 300 is performed during a writing phase. In some embodiments, the method 300 includes more, fewer, or different operations than shown in FIG. 3.

In an operation 310, the memory controller 105 writes data to a SRAM. In one approach, the memory controller 105 selects an MTJ cell to store a bit, and determines a SRAM coupled to the selected MTJ cell. The memory controller 105 may apply a voltage or current corresponding to the bit to be stored to bit lines BL, BLB coupled to the SRAM. For example, to store a bit '0', the memory controller 105 applies a high voltage (e.g., VDD) to the bit line BL and applies a low voltage (e.g., GND) to the bit line BLB. The memory controller 105 may apply a high voltage (e.g., VDD) to a word line WL coupled to the determined SRAM, while the voltage or current corresponding to the bit to be stored are applied to the bit lines BL, BLB. In response to the high voltage applied to the word line WL, the pass transistors Ts1, Ts2 of the SRAM can be enabled to transfer voltages at the bit lines BL, BLB to the ports Q, Qb, respectively. The memory controller 105 may apply a low voltage (e.g., GND) to control lines of pass transistors coupled to the MTJ cells and the reference MTJ cells to disable the pass transistors coupled to the MTJ cells and the reference MTJ cells, while the high voltage is applied to the word line WL to enable the pass transistors Ts1, Ts2 of the SRAM. Hence, the SRAM can sense and amplify a difference in voltages at the ports Q, Qb. For example, a voltage applied to the bit line BL may be 0.4V, and a voltage applied to the bit line BLB may be 0.5V. The SRAM can sense voltages at the bit lines BL, BLB through the pass transistors Ts1, Ts2, and amplify a difference in voltages at the bit lines BL, BLB, such that a voltage at the port Q becomes a low voltage (e.g., GND) and a voltage at the port Qb becomes a high voltage (e.g., VDD).

In an operation 320, the memory controller 105 applies a program voltage to a select line coupled to the selected MTJ cell. In one approach, the memory controller 105 may apply a high voltage (e.g., VDD) to the select line CSL to program or configure the selected MTJ cell to have a parallel state Rp. Similarly, the memory controller 105 may apply a low voltage (e.g., GND) to the select line CSL to program or configure the selected MTJ cell to have an anti-parallel state Rap.

In an operation 330, the memory controller 105 enables a pass transistor coupled to the selected MTJ cell to program or write a bit to the selected MTJ cell. The memory controller 105 may also provide a voltage for programming to a select line CSL coupled to the selected MTJ cell. The memory controller 105 may apply a high voltage (e.g., VDD) to a control line of a pass transistor coupled to the selected MTJ cell to enable the pass transistor coupled to the selected MTJ cell. In one example, if a high voltage (e.g., VDD) is applied to a free layer of the MTJ cell and a low voltage (e.g., GND) is applied to a pinned layer of the MTJ cell for at least a time period (e.g., 30 ns), the MTJ cell can be programmed to have a parallel state Rp. In one example, if the high voltage (e.g., VDD) is applied to the free layer of the MTJ cell and the high voltage (e.g., VDD) is applied to the pinned layer of the MTJ cell, a state of the MTJ cell may not change. In one example, if the low voltage (e.g., GND) is applied to the free layer of the MTJ cell and the high voltage (e.g., VDD) is applied to the pinned layer of the MTJ cell for at least a time period (e.g., 30 ns), the MTJ cell can be programmed to have an anti-parallel state Rap. In one example, if the low voltage (e.g., GND) is applied to the free layer of the MTJ cell and the low voltage (e.g., GND) is applied to the pinned layer of the MTJ cell, a state of the MTJ cell may not change. In one approach, the memory controller 105 may apply the low voltage (e.g., GND) to the other control lines of pass transistors coupled to the unselected MTJ cells and the reference MTJ cells, while the high voltage (e.g., VDD) is applied to the control line of the pass transistor coupled to the selected MTJ cell. Moreover, the memory controller 105 may apply a low voltage (e.g., GND) to the word line WL coupled to the pass transistors Ts1, Ts2, while the high voltage (e.g., VDD) is applied to the control line of the pass transistor coupled to the selected MTJ cell. Hence, a voltage at the port Q or the port Qb coupled to the selected MTJ cell can be applied to the selected MTJ cell, but not to non-selected MTJ cells.

Figure 4:
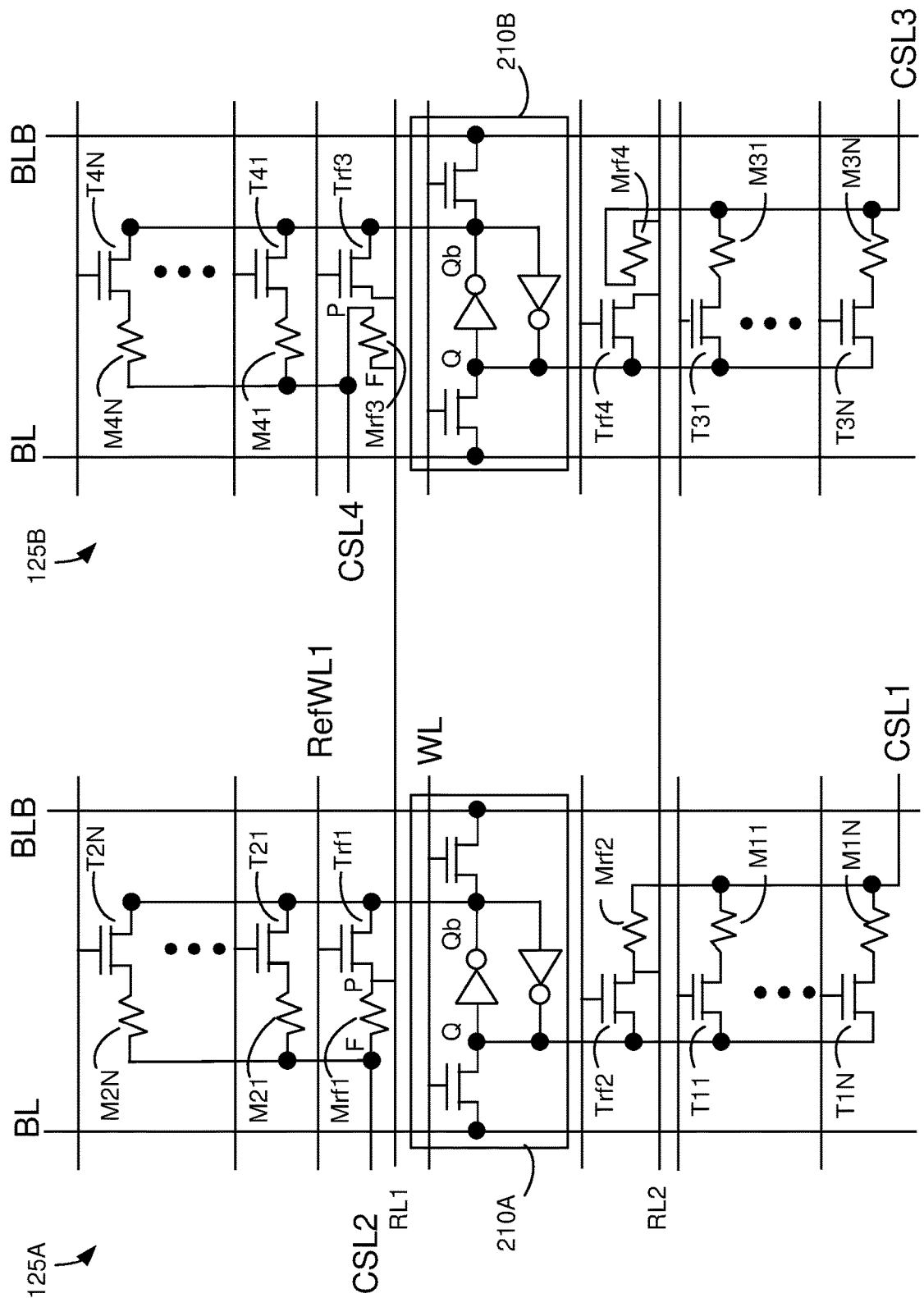
FIG. 4 is a diagram of two storage circuits, each including SRAM and multiple MTJ cells, in accordance with some embodiments.

FIG. 4 is a diagram of two storage circuits 125A, 125B, each including SRAM and multiple MTJ cells, in accordance with some embodiments. In one aspect, the storage circuits 125A, 125B are part of the memory array 120 of FIG. 1. In one configuration, the storage circuits 125A, 125B are disposed adjacent to each other. In one configuration, additional storage circuits or other components may be disposed between the storage circuits 125A, 125B.

In some embodiments, each of the storage circuits 125A, 125B has a similar configuration with each other as described above with respect to FIG. 2, except reference MTJ cells of the storage circuit 125A and reference MTJ cells of the storage circuit 125B are arranged in different configurations.

In some embodiments, the storage circuit 125A includes a first SRAM 210A with a first port Q and a second port Qb. Each of a first set of MTJ cells M11 . . . M1N and a corresponding one of a first set of pass transistors T11 . . . T1N may be coupled to each other in series between a first select line CSL1 and the port Q of the first SRAM 210A. Similarly, each of a second set of MTJ cells M21 . . . M2N and a corresponding one of a second set of pass transistors T21 . . . T2N may be coupled to each other in series between a second select line CSL2 and the port Qb of the first SRAM 210A. Moreover, a reference MTJ cell Mrf2 and a pass transistor Trf2 may be coupled to each other in series between the first select line CSL1 and the port Q of the first SRAM 210A, and a reference MTJ cell Mrf1 and a pass transistor Trf1 may be coupled to each other in series between the second select line CSL2 and the port Qb of the first SRAM 210A.

In some embodiments, the storage circuit 125B includes a second SRAM 210B with a first port Q and a second port Qb. Each of a third set of MTJ cells M31 . . . M3N and a corresponding one of a third set of pass transistors T31 . . . T3N may be coupled to each other in series between a third select line CSL3 and the port Q of the second SRAM 210B. Similarly, each of a fourth set of MTJ cells M41 . . . M4N and a corresponding one of a fourth set of pass transistors T41 . . . T4N may be coupled to each other in series between a fourth select line CSL4 and the port Qb of the second SRAM 210B. Moreover, a reference MTJ cell Mrf4 and a pass transistor Trf4 may be coupled to each other in series between the third select line CSL3 and the port Q of the second SRAM 210B, and a reference MTJ cell Mrf3 and a pass transistor Trf3 may be coupled to each other in series between the fourth select line CSL4 and the port Qb of the second SRAM 210B.

In one aspect, reference MTJ cells of the storage circuit 125A and reference MTJ cells of the storage circuit 125B are arranged in different configurations. In one example, a free layer of a reference MTJ cell Mrf1 of the storage circuit 125A is coupled to a select line CSL2 and a pinned layer of the reference MTJ cell Mrf1 of the storage circuit 125A is coupled to an electrode of a pass transistor Trf1 of the storage circuit 125A, where a pinned layer of a reference MTJ cell Mrf3 of the storage circuit 125B is coupled to a select line CSL4 and a free layer of the reference MTJ cell Mrf3 of the storage circuit 125B is coupled to an electrode of a pass transistor Trf3 of the storage circuit 125B. In one aspect, a pinned layer of the reference MTJ cell Mrf1 is coupled to a free layer of the reference MTJ cell Mrf3 though a reference line RL1. In this configuration, the reference MTJ cell Mrf1 and the reference MTJ cell Mrf3 are programmed with opposite states, such that resistance at the reference line RL1 becomes an average of a resistance of an MTJ cell at a first state (e.g., Rp state) and a resistance of the MTJ cell at a second state (e.g., Rap state). The reference MTJ cell Mrf2 of the storage circuit 125A and the reference MTJ cell Mrf4 of the storage circuit 125B are connected to each other through a reference line RL2, in a similar manner with respect to the reference MTJ cells Mref1, Mref3 and the reference line RL1. In one aspect, the average resistance at the reference line RL can be applied to the SRAM 210 for reading data as described below with respect to FIGS. 6 and 7.

Figure 5:
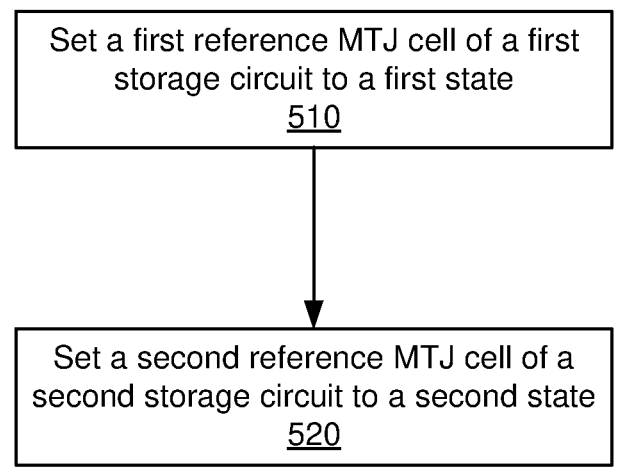
FIG. 5 is a flowchart of a method of programming reference MTJ cells of a storage circuit including SRAM and multiple MTJ cells, in accordance with some embodiments.

FIG. 5 is a flowchart of a method 500 of programming reference cells of the storage circuit 125, in accordance with some embodiments. The method 500 may be performed by the memory controller 105 of FIG. 1. In some embodiments, the method 500 is performed by other entities. In one aspect, the method 500 is performed during a reference set phase. The reference set phase may be executed before the writing phase, after the writing phase, or periodically. In some embodiments, the method 500 includes more, fewer, or different operations than shown in FIG. 5.

In an operation 510, the memory controller 105 sets a first reference MTJ cell (e.g., Mrf1) of a first storage circuit (e.g., storage circuit 125A) to a first state. In an operation 520, the memory controller 105 sets a second reference MTJ cell (e.g., Mrf2) of a second storage circuit (e.g., storage circuit 125B) to a second state. In one aspect, the first reference MTJ cell is coupled to the second reference MTJ cell through a reference line (e.g., RL1). In some embodiments, the operations 510, 520 are performed simultaneously or sequentially. In one aspect, a process of setting or programming a reference MTJ cell is similar to the process of setting or programming a MTJ cell as described above with respect to FIG. 3. Advantageously, setting or programming reference MTJ cells allows MTJ cells coupled to different ports of the SRAM to store data in an asymmetrical manner or a non-differential manner to improve storage density. For example, data stored by a first MTJ cell coupled to a first port of SRAM can be read, according to or with respect to the reference MTJ cell coupled to a second port of the SRAM. Hence, a second MTJ cell coupled to the second port of the SRAM may not store data that is differential or corresponding to the data stored by the first MTJ cell coupled to the first port of the SRAM. Instead, the second MTJ cell coupled to the second port of the SRAM may store data that is not related to the data stored by the first MTJ cell coupled to the first port of the SRAM.

Figure 6:
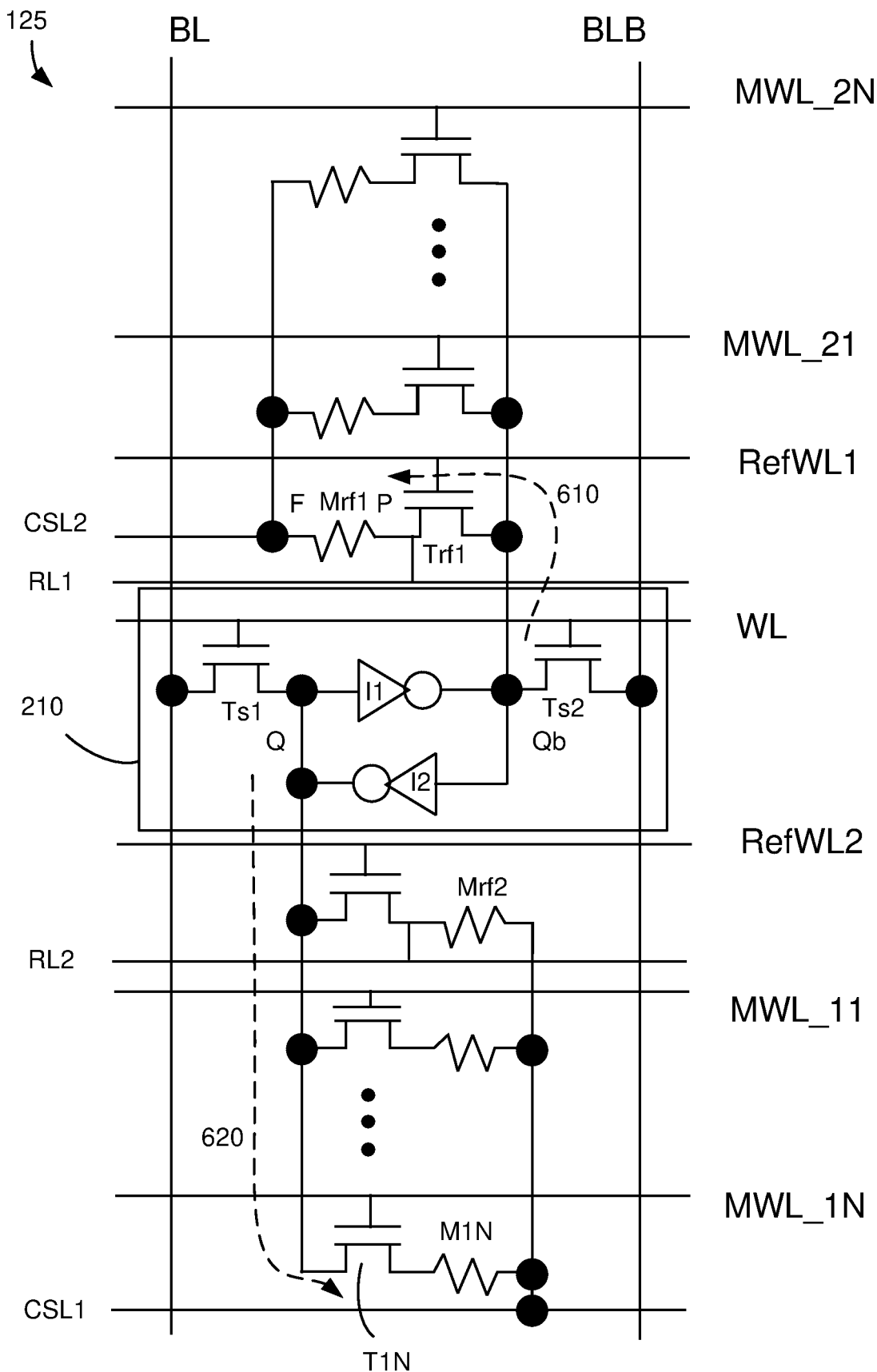
FIG. 6 is a diagram of a storage circuit including SRAM and multiple MTJ cells in a reading phase, in accordance with some embodiments.

FIG. 6 is a diagram of a storage circuit 125 including SRAM 210 and multiple MTJ cells in a reading phase, in accordance with some embodiments. In one aspect, to read a bit stored by MTJ cell coupled to a first port of the SRAM 210, the memory controller 105 utilizes a reference MTJ cell coupled to a second port of the SRAM 210. For example, to read a bit stored by MTJ cell coupled to a first port of the SRAM 210, the memory controller 105 applies an average resistance at a reference line coupled to a second port of the SRAM 210.

To read a bit stored by a MTJ cell of a first set of MTJ cells coupled to the port Q, the memory controller 105 may apply a high voltage (e.g., VDD) to the control line RefWL1 to enable the pass transistor Trf1 coupled to the port Qb. When the pass transistor Trf1 coupled to the port Qb is enabled, the average resistance of the reference MTJ cell Mrf1 at the reference line RL1 can be provided to the port Qb. To read a bit stored by the MTJ cell M1N, the memory controller 105 applies a high voltage (e.g., VDD) to the control line MWL_1N of a pass transistor T1N to enable the pass transistor T1N. Accordingly, a programmed resistance of the selected MTJ cell can be provided to the port Q. The memory controller 105 may disable pass transistors coupled to unselected MTJ cells and pass transistors Ts1, Ts2 of the SRAM 210, while pass transistors coupled to the selected MTJ cells (e.g., Mrf1, M1N) are enabled.

The SRAM 210 can amplify a difference in voltages at the port Q and the port Qb according to the average resistance of the MTJ cell at the reference line and a resistance of the selected MTJ cell. In one example, when the average resistance of the reference MTJ cell Mrf1 at the reference line RL1 is applied to the port Qb, current 610 can flow through the reference MTJ cell Mrf1 according to the average resistance of the reference MTJ cell Mrf1 at the reference line RL1. Similarly, when the resistance of the selected MTJ cell is applied to the port Q, current 620 can flow through the selected MTJ cell according to the resistance of the selected MTJ cell. Thus, voltages at the ports Q, Qb can diverge, according to a difference in the current 610, 620. The SRAM 210 and sense and amplify the difference in the voltages at the ports Q, Qb. For example, the inverters I1, I2 sense a voltage 0.4 V at the port Q and a voltage 0.5V at the port Qb, and amplify the voltages at the ports Q, Qb through a positive feedback (or a regenerative feedback) such that the voltage at the port Q becomes GND and the voltage at the port Qb becomes VDD (e.g. 1V).

After the voltages at the ports Q, Qb are amplified, the memory controller 105 may receive and sense voltages at the ports Q, Qb through the bit lines BL, BLB. For example, the memory controller 105 can apply a high voltage (e.g., VDD) to the word line WL to enable the pass transistors Ts1, Ts2 of the SRAM, such that voltages at the ports Q, Qb can be provided to the bit lines BL, BLB, respectively. The memory controller 105 may apply a low voltage (e.g., GND) to the pass transistors coupled to the MTJ cells to disable the pass transistors coupled to the MTJ cells, while the pass transistors Ts1, Ts2 of the SRAM are enabled. The memory controller 105 may receive and sense voltages through the bit lines BL, BLB, and determine a bit stored by the selected MTJ cell according to the sensed voltages. By sensing a bit stored by a MTJ cell coupled to a first port of the SRAM 210 using a reference MTJ cell coupled to a second port of the SRAM 210, MTJ cells at the port Q and MTJ cells at the port Qb may store data in an asymmetrical manner to improve storage density. For example, data stored by a first MTJ cell coupled to the port Q of SRAM can be read, according to or with respect to the reference MTJ cell coupled to the port Qb of the SRAM. Hence, a second MTJ cell coupled to the port Qb of the SRAM may not store data that is differential or corresponding to the data stored by the first MTJ cell coupled to the port Q of the SRAM. Instead, the second MTJ cell coupled to the port Qb of the SRAM may store data that is not related to the data stored by the first MTJ cell coupled to the port Q of the SRAM.

The process of reading a bit stored by a MTJ cell of a second set of MTJ cells coupled to the port Qb is similar to the process of reading a bit stored by a MTJ cell of a first set of MTJ cells coupled to the port Q, except the reference MTJ cell Mrf2 coupled to the port Q is utilized instead of the reference MTJ cell Mrf1 coupled to the port Qb. Thus, detailed description thereof is omitted herein for the sake of brevity.

Figure 7:
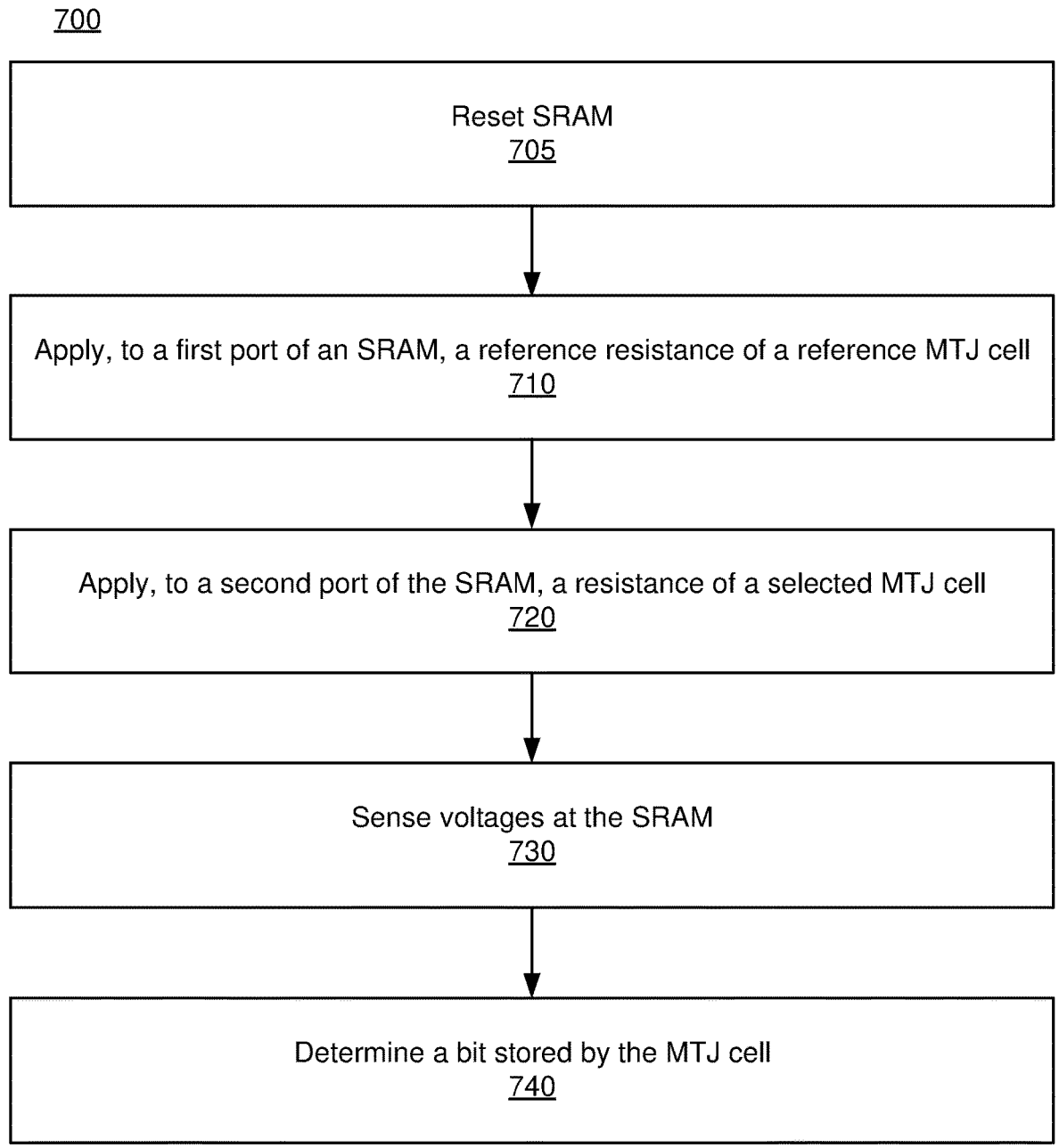
FIG. 7 is a flowchart of a method of reading data from a storage circuit including SRAM and multiple MTJ cells, in accordance with some embodiments.

FIG. 7 is a flowchart of a method 700 of reading data from a storage circuit including SRAM 210 and multiple MTJ cells, in accordance with some embodiments. The method 700 may be performed by the memory controller 105 of FIG. 1. In some embodiments, the method 700 is performed by other entities. In one aspect, the method 700 is performed during a reading phase. In some embodiments, the method 700 includes more, fewer, or different operations than shown in FIG. 7.

In an operation 705, the memory controller 105 resets the SRAM 210. In one example, the memory controller 105 may power off the SRAM 210 to reset voltages at the ports Q, Qb to a low voltage (e.g., GND).

In an operation 710, the memory controller 105 applies, to one of the ports Q, Qb of the SRAM 210, a reference resistance of a reference MTJ cell at a reference line coupled to the other of the ports Q, Qb of the SRAM 210. The reference resistance may be an average resistance of a resistance of the reference MTJ cell in a first state (e.g., Rp state) and a resistance of the reference MTJ cell in a second state (e.g., Rap state) at the reference line. In an operation 720, the memory controller 105 applies, to the other of the ports Q, Qb of the SRAM 210, a resistance of a selected MTJ cell. The operations 710, 720 may be performed simultaneously or in a different sequence. In one example, to read a bit stored by a MTJ cell T1N of a first set of MTJ cells coupled to the port Q, the memory controller 105 may enable the pass transistor Trf1 coupled to the port Qb. When the pass transistor Trf1 coupled to the port Qb is enabled, the reference resistance at the reference line RL1 can be provided to the port Qb. Meanwhile, the memory controller 105 may enable the pass transistor T1N coupled to the selected MTJ cell T1N. Accordingly, a programmed resistance of the selected MTJ cell can be provided to the port Q. The memory controller 105 may disable pass transistors coupled to unselected MTJ cells and pass transistors Ts1, Ts2 of the SRAM 210, while pass transistors coupled to the selected MTJ cells (e.g., Mrf1, M1N) are enabled. The memory controller 120 may also apply a low voltage (e.g., GND) to the select lines CSL1, CSL2 in the reading phase.

The memory controller 105 may configure the SRAM 210 to amplify a difference in voltages at the ports Q, Qb, according to the reference resistance at the reference line and a resistance of the selected MTJ cell. The memory controller 105 may provide power to the SRAM 210 such that voltages at the ports Q, Qb can be increased. In one aspect, according to a difference in the reference resistance at the reference line and the resistance of the selected MTJ cell, voltages at the ports Q, Qb can diverge. Moreover, the SRAM 210 can amplify a difference in voltages at the ports Q, Qb through positive feedback (or regenerative feedback). For example, the inverters I1, I2 sense a voltage 0.4 V at the port Q and a voltage 0.5V at the port Qb, and amplify a difference in the voltages at the ports Q, Qb through a positive feedback (or a regenerative feedback) such that the voltage at the port Q becomes GND and the voltage at the port Qb becomes VDD (e.g. 1V).

In an operation 730, the memory controller 105 receives and senses voltages at the SRAM. For example, the memory controller 105 can apply a high voltage (e.g., VDD) to the word line WL to enable the pass transistors Ts1, Ts2 of the SRAM, such that voltages at the ports Q, Qb can be provided to the bit lines BL, BLB, respectively. The memory controller 105 may apply a low voltage (e.g., GND) to the pass transistors coupled to the MTJ cells to disable the pass transistors coupled to the MTJ cells, while the pass transistors Ts1, Ts2 of the SRAM are enabled.

In an operation, 740, the memory controller 105 determines a bit stored by the selected MTJ cell. The memory controller 105 may compare voltages at the ports Q, Qb of the SRAM 210 received through the bit lines BL, BLB, and determine the bit stored by the selected MTJ cell according to the comparison. For example, the memory controller 105 may determine that a bit stored by the MTJ cell is '0', in response to the voltage at the port Q being higher than the voltage at the port Qb. For another example, the memory controller 105 may determine that a bit stored by the MTJ cell is '1', in response to the voltage at the port Qb being higher than the voltage at the port Q.

Figure 8:
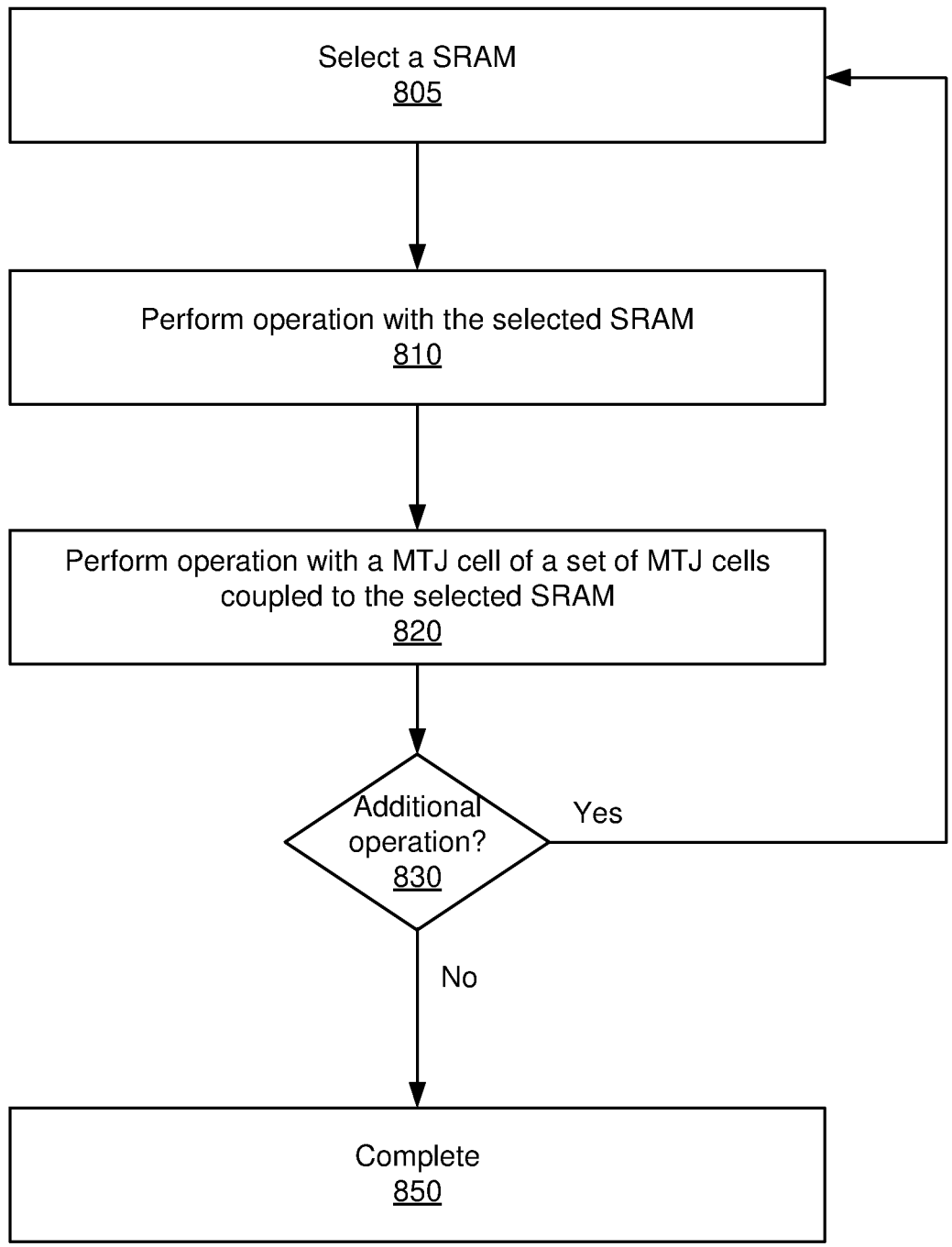
FIG. 8 is a flowchart of a method of a pipeline operation of storage circuits each including SRAM and multiple MTJ cells, in accordance with some embodiments.

FIG. 8 is a flowchart of a method 800 of pipeline operations of storage circuits each including SRAM 210 and multiple MTJ cells, in accordance with some embodiments. The method 800 may be performed by the memory controller 105 of FIG. 1. In some embodiments, the method 800 is performed by other entities. In one aspect, the method 800 is performed during a reading phase, a writing phase, and/or a reference reset phase. In some embodiments, the method 800 includes more, fewer, or different operations than shown in FIG. 8.

In an operation 805, the memory controller 105 selects a SRAM 210. In one example, the memory controller 105 selects a MTJ cell to perform operation (e.g., read or write), and determines, from a plurality of storage circuits, a storage circuit including the selected MTJ cell. The memory controller 105 may select SRAM 210 of the determined storage circuit coupled to the selected MTJ cell.

In an operation 810, the memory controller 105 performs an operation (e.g., read or write) with the selected SRAM 210. In an operation 820, the memory controller 105 performs an operation with the selected MTJ cell of the set of MTJ cells coupled to the SRAM 210. For example, to write data, the memory controller 105 writes a bit to the selected SRAM 210, then transfers the bit stored by the SRAM 210 to the selected MTJ cell. In one aspect, writing data to the SRAM 210 can be performed within a short time period (e.g., 1 ns), whereas writing data to the MTJ cell can be performed within a longer time period (e.g., 30 ns).

In an operation 830, the memory controller 105 determines whether there is an additional operation to perform. If there is an additional operation to perform, the memory controller 105 may return to the operation 805, and select another SRAM 210 to perform the additional operation. For example, if there is an additional data to write, the memory controller 105 may select a subsequent SRAM 210. In one aspect, the memory controller 105 may perform operation on the SRAM 210 during a first time period, and perform the additional operation on another SRAM 210 during a second time period, where the first time period and the second time period partially overlap with each other in a pipeline configuration. Hence, the memory controller 105 can improve a speed of writing data to MTJ cells.

In an operation 850, if there is no additional operation to perform, the memory controller 105 may complete the method 800, or wait for additional operations to perform.

Figure 9:
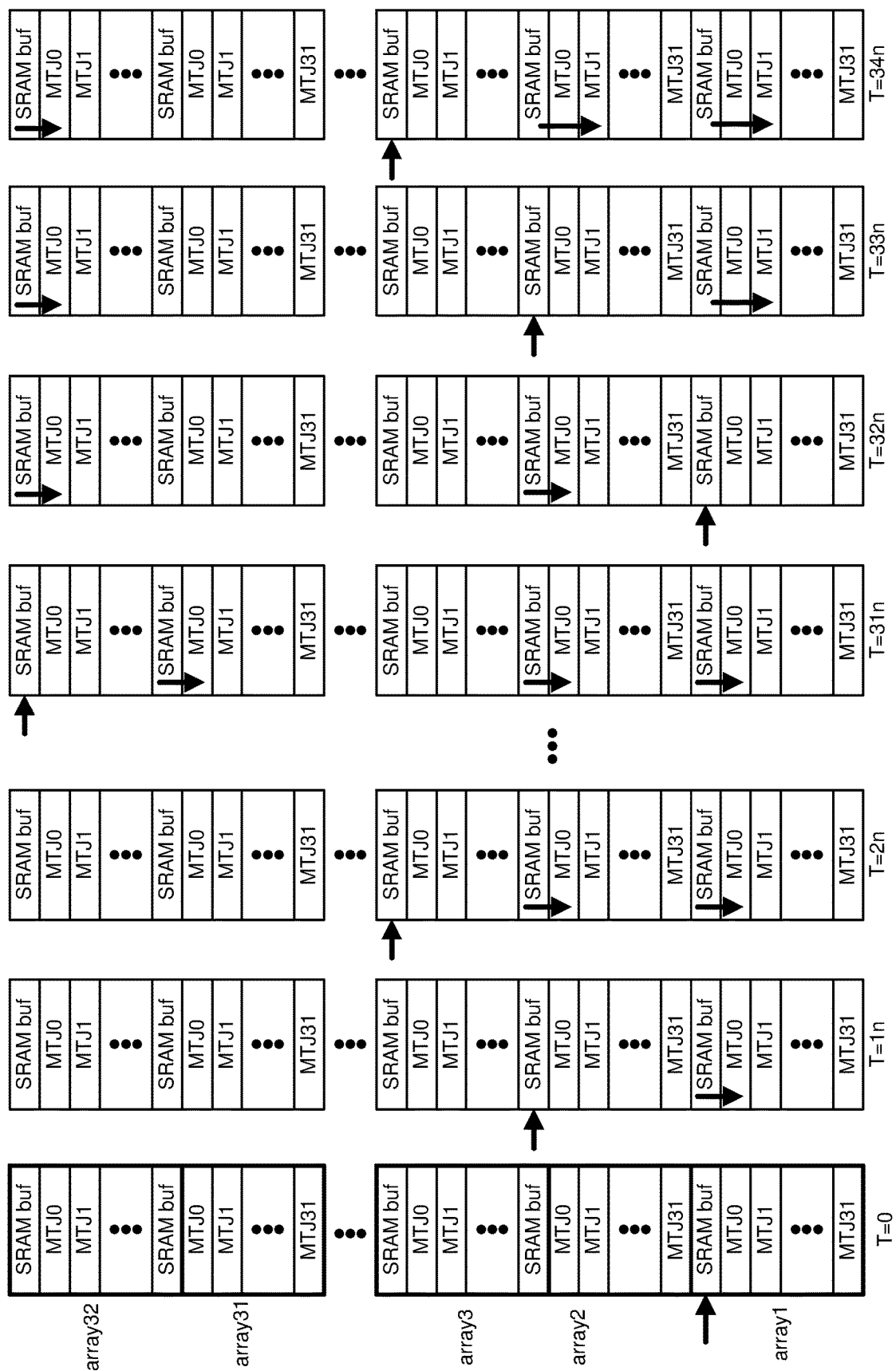
FIG. 9 is a timing diagram of a pipeline operation of storage circuits, each including SRAM and multiple MTJ cells, in accordance with some embodiments.

FIG. 9 is a timing diagram of a pipeline operation of storage circuits of the memory device 100, and FIG. 10 is a table describing the pipeline operation of the memory device 100, in accordance with some embodiments. As described above with respect to FIG. 8, the memory controller 105 may perform operations in a pipeline configuration. In one example, the memory array 120 includes 32 storage circuits (e.g., arrays 1-32), where each storage circuit includes a SRAM 210 and 32 MTJ cells.

For example, at time 0 ns, the memory controller 105 may write data to a SRAM 210 of a storage circuit (e.g., array 1). Between time 1 ns and 31 ns, the memory controller 105 may configure the SRAM 210 of the storage circuit (e.g., array 1) to transfer data to a first MTJ cell MTJ0 of the array 1 to write a bit to the first MTJ cell MTJ0 of the array 1. For another example, at time 1 ns, the memory controller 105 may write data to a SRAM 210 of another storage circuit (e.g., array 2). Between time 2 ns and 32 ns, the memory controller 105 may configure the SRAM 210 of the storage circuit (e.g., array 2) to transfer data to a first MTJ cell MTJ0 of the array 2 to write a bit to the first MTJ cell MTJ0 of the array 2. Hence, a time period for writing data to the MTJ cell in the first array and a time period for writing data to the MTJ cell in the second array may partially overlap with each other. In one example, at time 32 ns after completing writing to the first MTJ cell MTJ0 of the array 1, the memory controller 105 may write data to the SRAM 210 of array 1. Between time 33 ns and 64 ns, the memory controller 105 may configure the SRAM 210 of the storage circuit (e.g., array 1) to transfer data to a second MTJ cell MTJ1 of the array 1 to write a bit to the second MTJ cell MTJ1 of the array 1. The memory controller 105 may read data from MTJ cells through a pipeline configuration in a similar manner. Through the pipeline operation as shown in FIGS. 9 and 10, the speed of writing data to or reading data from the MTJ cells can be improved.

Figure 11:
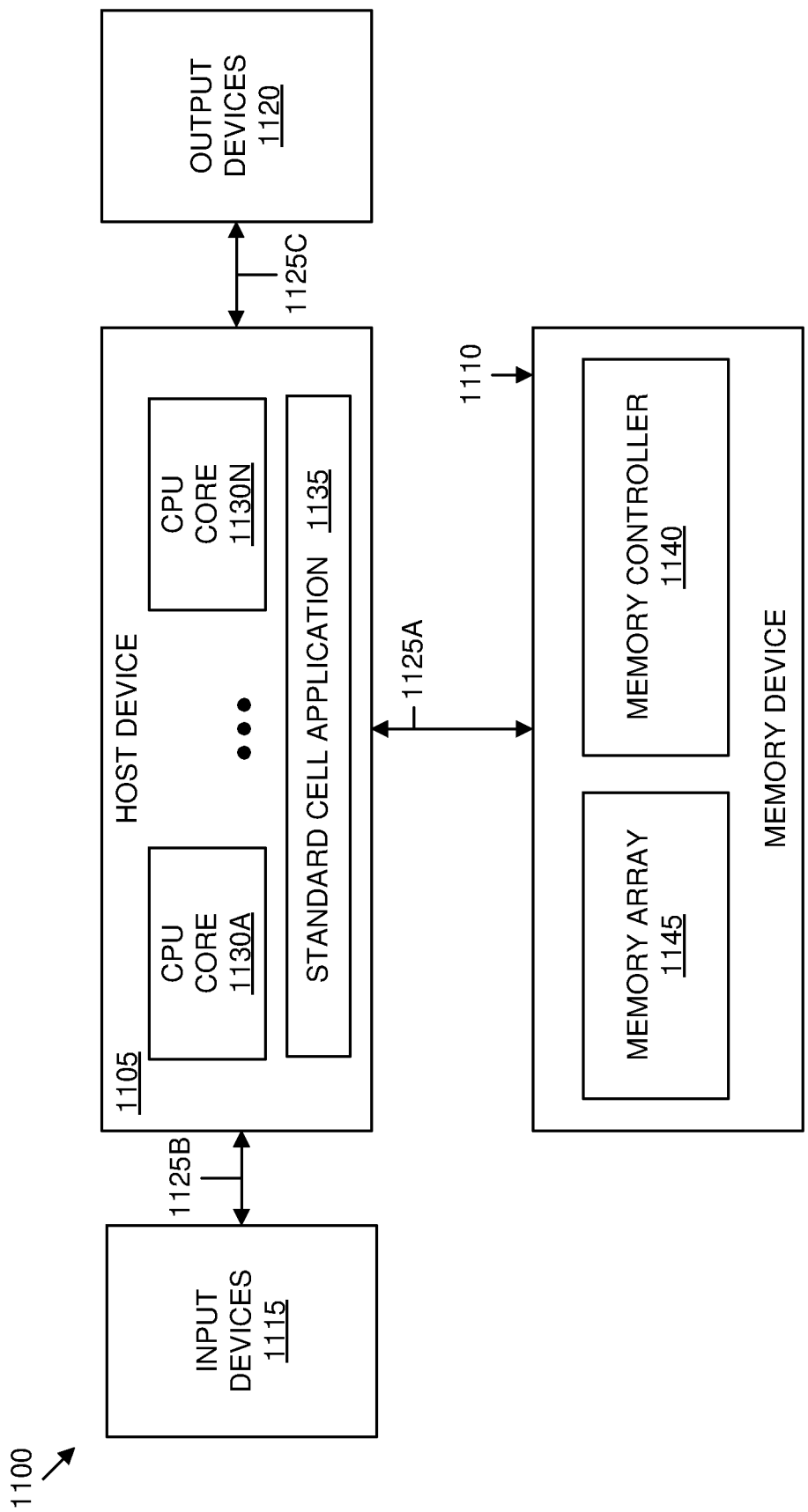
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100 or a portion of the memory device 100 can be fabricated according to the layout design by a fabrication facility.

Referring still to FIG. 11, the memory device 1110 includes a memory controller 1140 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11.

However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to an integrated circuit. In some embodiments, the integrated circuit includes a first SRAM having a first port and a second port. In some embodiments, the integrated circuit includes a first set of pass transistors coupled to the first port of the first SRAM. In some embodiments, the integrated circuit includes a first set of MTJ cells, where each of the first set of MTJ cells is coupled between a first select line and a corresponding one of the first set of pass transistors.

One aspect of this description relates to a device. In some embodiments, the device includes a first SRAM and a second SRAM. In some embodiments, the device includes a first set of MTJ cells coupled to the first SRAM and a second set of MTJ cells coupled to the second SRAM. In some embodiments, the device includes a memory controller configured to write a first bit to one of the first set of MTJ cells through the first SRAM during a first time period, and write a second bit to one of the second set of MTJ cells through the second SRAM during a second time period. The first time period and the second time period may partially overlap with each other.

One aspect of this description relates to a method of operating a memory device. In some embodiments, the method includes applying, to a first port of a first SRAM, a reference resistance. In some embodiments, the method includes applying, to a second port of the first SRAM, a resistance of one of a first set of MTJ cells. The first SRAM may generate a voltage at the first port or the second port of the first SRAM according to a difference between the reference resistance applied to the first port and the resistance of the one of the first set of MTJ cells applied to the second port of the first SRAM. In some embodiments, the method includes determining a bit stored by the one of the first set of MTJ cells according to the voltage.

In some embodiments, a first reference MTJ cell is coupled to the first SRAM and a second reference MTJ cell is coupled to a second SRAM. The first set of MTJ cells may be coupled to the second reference MTJ cell through a reference line. In some embodiments, the method includes programming the first reference MTJ cell in a first state and programming the second reference MTJ cell in a second state. The reference resistance may be an average of a first resistance of the first reference MTJ cell in the first state and a second resistance of the second reference MTJ cell in the second state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first static random access memory (SRAM) having a first port and a second port;
   a plurality of first magnetic tunnel junction (MTJ) cells each coupled between a first select line and the second port of the first SRAM, the first MTJ cells including a first reference MTJ cell further coupled to a first reference line; and
   a plurality of second MTJ cells each coupled between a second select line and the first port of the first SRAM, the second MTJ cells including a second reference MTJ cell further coupled to a second reference line;
   wherein the first reference MTJ cell presents an average resistance of a first resistance and a second resistance while one of the plurality of second MTJ cells, other than the second reference MTJ cell, is selected to be read, and the second reference MTJ cell presents the average resistance while one of the plurality of first MTJ cells, other than the first reference MTJ cell, is selected to be read.

2. The integrated circuit of claim 1, wherein the first reference line is coupled to a pinned layer of the first reference MTJ cell, and the second reference line is coupled to a pinned layer of the second reference MTJ cell.

3. The integrated circuit of claim 1, wherein the average resistance of the first reference MTJ cell is configured to be provided to the second port, and the average resistance of the second reference MTJ cell is configured to be provided to the first port.

4. The integrated circuit of claim 3, wherein a programmed resistance state of the selected second MTJ cell is configured to be provided to the first port, and a programmed resistance state of the selected first MTJ cell is configured to be provided to the second port.

5. The integrated circuit of claim 4, wherein the programmed resistance state is equal to either the first resistance or the second resistance.

6. The integrated circuit of claim 1, further comprising:
   a second SRAM having a third port and a fourth port;
   a plurality of third MTJ cells each coupled between a third select line and the third port of the second SRAM, the third MTJ cells including a third reference MTJ cell further coupled to the first reference line; and
   a plurality of fourth MTJ cells each coupled between a fourth select line and the fourth port of the second SRAM, the fourth MTJ cells including a fourth reference MTJ cell further coupled to the second reference line;
   wherein the third reference MTJ cell presents the average resistance while one of the plurality of fourth MTJ cells, other than the fourth reference MTJ cell, is selected to be read, and the fourth reference MTJ cell presents the average resistance while one of the plurality of third MTJ cells, other than the third reference MTJ cell, is selected to be read.

7. The integrated circuit of claim 6, wherein the first MTJ reference cell and third MTJ reference cell are programmed in a first resistance state and a second resistance state, respectively, such that a resistance at the first reference line is an average resistance of the first resistance and the second resistance.

8. The integrated circuit of claim 6, wherein the second MTJ reference cell and fourth MTJ reference cell are programmed in a first resistance state and a second resistance state, respectively, such that a resistance at the second reference line is an average resistance of the first resistance and the second resistance.

9. The integrated circuit of claim 6, wherein the first reference line is coupled to a free layer of the third reference MTJ cell, and the second reference line is coupled to a free layer of the fourth reference MTJ cell.

10. The integrated circuit of claim 1, wherein the first SRAM is configured to amplify a voltage difference between the first port and the second port.

11. The integrated circuit of claim 10, wherein a bit stored by the selected first or second memory cell is configured to be determined based on the amplified voltage difference.

12. An integrated circuit, comprising:
a first inverter and a second inverter cross coupled to each other at a first port and a second port;
a plurality of first magnetic tunnel junction (MTJ) cells each coupled between a first select line and the second port, the first MTJ cells including a first reference MTJ cell further coupled to a first reference line; and
a plurality of second MTJ cells each coupled between a second select line and the first port, the second MTJ cells including a second reference MTJ cell further coupled to a second reference line;
wherein the first reference MTJ cell presents an average resistance of a first resistance and a second resistance while one of the plurality of second MTJ cells, other than the second reference MTJ cell, is selected to be read, and the second reference MTJ cell presents the average resistance while one of the plurality of first MTJ cells, other than the first reference MTJ cell, is selected to be read.

13. The integrated circuit of claim 12, wherein the first reference line is coupled to a pinned layer of the first reference MTJ cell, and the second reference line is coupled to a pinned layer of the second reference MTJ cell.

14. The integrated circuit of claim 12, wherein the average resistance of the first reference MTJ cell is configured to be provided to the second port, and the average resistance of the second reference MTJ cell is configured to be provided to the first port.

15. The integrated circuit of claim 14, wherein a programmed resistance state of the selected second MTJ cell is configured to be provided to the first port, and a programmed resistance state of the selected first MTJ cell is configured to be provided to the second port.

16. The integrated circuit of claim 15, wherein the programmed resistance state is equal to either the first resistance or the second resistance.

17. The integrated circuit of claim 12, wherein the first and second inverters are collectively configured to amplify a voltage difference between the first port and the second port.

18. The integrated circuit of claim 17, wherein a bit stored by the selected first or second memory cell is configured to be determined based on the amplified voltage difference.

19. An integrated circuit comprising:
a first static random access memory (SRAM) having a first port and a second port coupled between a pair of first bit lines;
a plurality of first magnetic tunnel junction (MTJ) cells each coupled between a first select line and the second port of the first SRAM, the first MTJ cells including a first reference MTJ cell further coupled to a first reference line;
a plurality of second MTJ cells each coupled between a second select line and the first port of the first SRAM, the second MTJ cells including a second reference MTJ cell further coupled to a second reference line;
a second SRAM having a third port and a fourth port coupled between a pair of second bit lines;
a plurality of third MTJ cells each coupled between a third select line and the third port of the second SRAM, the third MTJ cells including a third reference MTJ cell further coupled to the first reference line; and
a plurality of fourth MTJ cells each coupled between a fourth select line and the fourth port of the second SRAM, the fourth MTJ cells including a fourth reference MTJ cell further coupled to the second reference line.

20. The integrated circuit of claim 19, wherein the first reference MTJ cell and second reference MTJ cell are programmed in a first data state, and the third reference MTJ cell and fourth reference MTJ cell are programmed in a second data state, respectively, the first and second data states being opposite to each other.

* * * * *